(12) United States Patent
Nicholson

(10) Patent No.: US 9,658,256 B2
(45) Date of Patent: May 23, 2017

(54) PORTABLE SPA MONITORING AND CONTROL CIRCUITRY

(71) Applicant: Watkins Manufacturing Corporation, Vista, CA (US)

(72) Inventor: Larry Nicholson, Fallbrook, CA (US)

(73) Assignee: Watkins Manufacturing Corporation, Vista, CA (US)

( * ) Notice: Subject to any disclaimer, the term of this patent is extended or adjusted under 35 U.S.C. 154(b) by 393 days.

(21) Appl. No.: 14/460,140

(22) Filed: Aug. 14, 2014

(65) Prior Publication Data

US 2014/0354309 A1 Dec. 4, 2014

Related U.S. Application Data

(62) Division of application No. 13/527,014, filed on Jun. 19, 2012, now Pat. No. 9,006,616.

(51) Int. Cl.
*H05B 1/02* (2006.01)
*G01R 19/00* (2006.01)

(52) U.S. Cl.
CPC ......... *G01R 19/0007* (2013.01); *H05B 1/025* (2013.01)

(58) Field of Classification Search
CPC ..................... H05B 1/025; G01R 19/0007

USPC ........ 219/483, 494, 497, 508; 361/1, 42, 56, 361/104, 185
See application file for complete search history.

(56) References Cited

U.S. PATENT DOCUMENTS 6,208,258 B1 * 3/2001 Redilla ............ G01R 19/16547
  323/284
2004/0149728 A1 * 8/2004 Metz .................... H05B 1/0208
  219/494

* cited by examiner

*Primary Examiner* — Thien S Tran
(74) *Attorney, Agent, or Firm* — Lapple Ubell IP Law, LLP; Franklin D. Ubell

(57) ABSTRACT

Control circuitry for controlling a spa water heater, wherein a microcontroller is configured to detect zero crossings of an A.C. line voltage from a voltage sense signal, to cause closing of a first heater relay and a second heater relay, to detect the time at which heater current is initially sensed by a current sensor after the initial closing of the second heater relay, to measure a time delay between the time that the second heater relay is closed and the time at which heater current is initially sensed, and to adjust the time at which a second closing of the second heater relay occurs such that zero crossings of the heater current occur at the same time as zero crossings of the voltage waveform. The control circuitry further includes a voltage sense circuit comprising a first diode connected in series with a current limiting resistance connected in series with a Zener diode, which is in turn connected in series with an optical coupler LED.

18 Claims, 6 Drawing Sheets

PORTABLE SPA MONITORING AND CONTROL CIRCUITRY

CROSS REFERENCE TO RELATED APPLICATIONS

This application is a divisional of and claims priority to U.S. Utility patent application Ser. No. 13/527,014, entitled "Portable Spa Monitoring and Control Circuitry," filed on Jun. 19, 2012, the contents of which is incorporated herein by reference in its entirety.

BACKGROUND OF THE INVENTION

Field of Invention

The subject disclosure relates to spa monitoring and control circuitry for portable spas, tubs and the like and more particularly to voltage sensing circuitry for determining the magnitude, frequency and zero cross times of an input signal, and to circuitry for timing the opening and closing of heater relays to occur at or near zero cross points.

Related Art

Portable spas have become quite popular as a result of their ease of use and multiplicity of features such as varied jet and seating configurations. One area where the inventor has recognized that improvement would be desirable concerns the manner of efficiently maintaining and controlling various spa equipment operations, and particularly the operation of the spa water heater and associated relays.

SUMMARY

The following is a summary description of illustrative embodiments of the invention. It is provided as a preface to assist those skilled in the art to more rapidly assimilate the detailed design discussion which ensues and is not intended in any way to limit the scope of the claims which are appended hereto in order to particularly point out the invention.

According to an illustrative embodiment, control circuitry for controlling a spa water heater comprises first and second relays closeable to supply current to the spa water heater together with a current sensor for generating a current sense signal, a voltage sensor circuit for generating a voltage sense signal, and a microcontroller supplied with the current sense and voltage sense signals. The microcontroller is configured to detect zero crossings from the voltage sense signal and to cause closing of the first heater relay and the second heater relay. The microcontroller is further configured to detect the time at which heater current is initially sensed by the current sensor after the initial closing of the second heater relay, and to measure a time delay between the time the second heater relay is closed and the time at which heater current is initially sensed. The microcontroller thereafter employs the measured time delay to adjust the time at which a second closing of the second heater relay occurs such that the closure of the relay contacts is synchronous with a zero crossing of the voltage waveform.

In an alternate embodiment, the same circuitry configuration may also be employed to control the supply of current to a spa pump motor.

In one embodiment, the voltage sensor circuit may comprise a first diode connected in series with a current limiting resistance connected in series with a Zener diode, which is in turn connected in series with an optical coupler LED. In this illustrative embodiment, an A.C. voltage to be sensed is coupled across one terminal of the first diode and one terminal of the optical coupler LED. The optical coupler LED comprises part of an optical coupler circuit whose output provides a voltage sense signal comprising a pulse train whose pulse width is proportional to the A.C. input voltage.

DETAILED DESCRIPTION OF THE DRAWINGS

DETAILED DESCRIPTION

Figure 1:
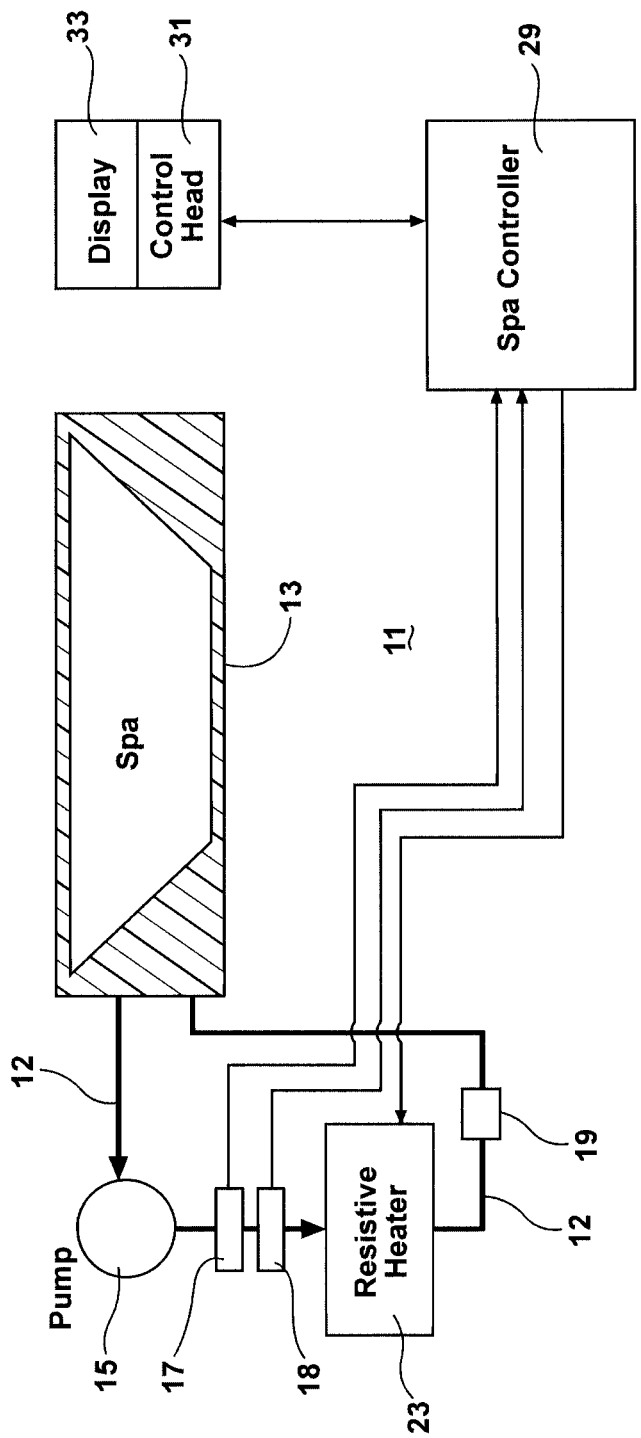
FIG. 1 is a schematic diagram of one embodiment of a spa system.

FIG. 1 illustrates one embodiment of a spa system 11. In this system 11, water is circulated through a water circulation path 12. In the water circulation path 12 are a spa tub 13, a circulation pump 15, a resistive heater 23, a spa controller 29, a regulating temperature thermistor 17, a high-limit thermistor 19, and a pressure sensor 18 to sense proper water flow. In one embodiment, the spa controller 29 interfaces with a control head 31, which includes a user interface 33. The spa controller 29 may include one or more microprocessors or microcontrollers, as well as fault detection hardware, which may receive inputs from the high limit temperature sensor 19, the temperature regulation sensor 17, and the pressure regulation sensor 18. In particular, the value sensed by the thermistor 17 may be used by the microcontroller 29 to regulate water temperature, and the value measured by thermistor 19 may be used to shut off heater operation if the water temperature exceeds, for example, 120° F. The controller 29 may further be configured to switch "on" or "off" the spa water heater 23, one or more jet pumps, the circulation pump 15, an ozone generator, an audio system and/or spa lights and external lighting.

Spa heaters such as the resistive heater 23 of FIG. 1 typically require significant power and their operation can shorten the life of the relays that switch the heater power as a result of relay contact arcing on turn-on and turn-off. According to an illustrative embodiment, opening and closing of a switching relay is timed to occur synchronously with the zero voltage crossing of the AC power line, thus minimizing arcing and wear. The illustrative embodiment senses the actual current to the heater 23, leaving no doubt when switching occurred and improves the system by providing early fault detection. The illustrative embodiment also provides additional protection against welded-closed relay contacts and the resulting fire hazard from continuous heater operation. The integrity of both relays is checked before proceeding, at a time when recovery and hazard prevention is still possible.

"Zero-cross switching" means that the relay contacts open or close at a time selected to cause the sine wave heater current to cross at or near zero near the time that the AC sine wave voltage changes its electrical polarity, resulting in minimal or no contact arcing and wear. The opposite of zero-cross switching is switching at peak voltage of the sine wave, which can result in significant arcing and contact wear, as well as increased potential for contact welding. In exemplary embodiments, the AC voltage frequency is 60 Hz and its RMS magnitude is 120 or 240 volts.

Figure 2:
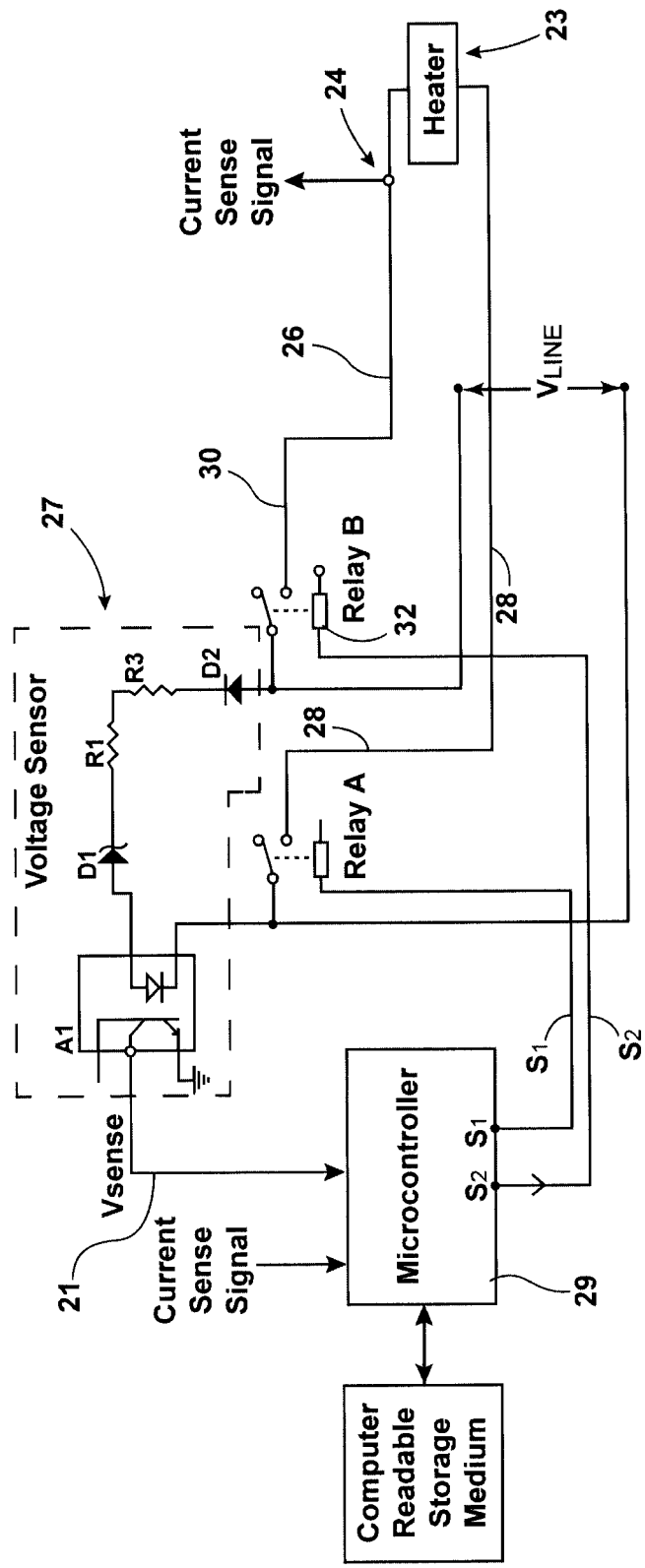
FIG. 2 is an electrical circuit diagram of an illustrative embodiment of spa monitoring and control circuitry.

A zero-cross switching circuit 111 according to an illustrative embodiment is shown in FIG. 2 and includes:
  a) A current sense transducer 24 capable of sensing the current waveform of current flowing to a heater 23. The transducer 24 may be, for example, a Hall Effect transducer or sensor;
  b) A zero cross detector circuit 27 to sense the timing of the supply voltage; and
  c) Two relays A, B to switch each leg 28, 30 of the line voltage to the heater element 23, called "Relay A" and "Relay B".

In the illustrative circuit embodiment of FIG. 2, the diode D2 is connected directly to the full line voltage $V_{LINE}$, typically in the range of 100 to 250 volts AC (50 or 60 hz).

Relay "Turn On" Operation

The operation of the illustrative embodiment is as follows: a signal $S_1$ from the controller 29 turns on the relay A without any zero crossing adjustment, while leaving relay B off. The controller 29 then checks to make sure that there is no heater current sensed by the current sense circuit 24. If no heater current is sensed, the control flow proceeds to the next step. If heater current is sensed, the controller 29 determines that the relay B is welded closed and that the circuit has failed, requiring appropriate corrective action to prevent creation of a safety hazard from uncontrolled heating if relay A is also welded closed. If no heater current is sensed, the relay B is then turned on by control signal $S_2$ after, for example, a 500 millisecond delay.

Assuming no heater current is sensed when the relay A is closed by signal $S_1$, the zero voltage crossing input line 21 from the zero cross detector 27 is monitored to sense the timing of the zero voltage crossings (positive or negative). The A.C. signal $V_{LINE}$ is applied to the zero cross detector 27 prior to closing the relay A, such that it is already detecting zero crossings prior to closing the relay A. The current sensor 24 is also monitored to determine when current starts flowing to the heater 23, representative of how long it took the relay B to close relative to when its coil 32 was energized (turned on) by applying a signal $S_2$. A predetermined delay time is then calculated so that the relay B will close at or near the zero voltage crossing the next time that the heater 23 is turned on.

Thus, the relay actuation time is tuned by:
  Turning on the relay B with zero delay adjustment from zero cross the first time that the heater 23 is turned on.
  Measuring the increase in current and relative timing from the current sensor 24 to determine an appropriate delay from the voltage zero cross to set the relay actuation time for the next time that the heater 23 is turned on.

Figure 3:
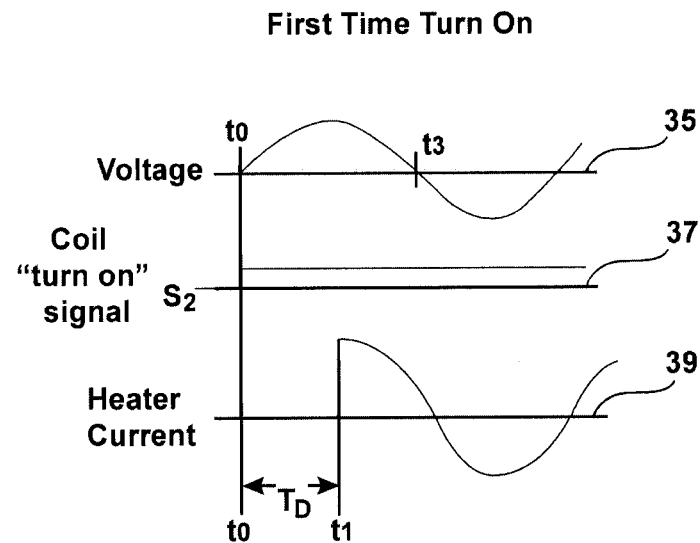
FIG. 3 is a wave form diagram illustrating operation of the circuit of FIG. 2 during a first heater "turn on" operation.

The delay time calculation is illustrated graphically in FIG. 3 where the relay B coil voltage, the control signal $S_2$ and the heater current are respectively graphed with respect to time on time lines 35, 37, 39. As illustrated, the signal $S_2$ is supplied to Relay B at time $t_0$, causing heater current to be sensed later at time $t_1$. The turn on delay between the application of the control signal $S_2$ and the generation of heater current is "$T_D$". This time interval "$T_D$" is detected and stored by the controller 29.

Figure 4:
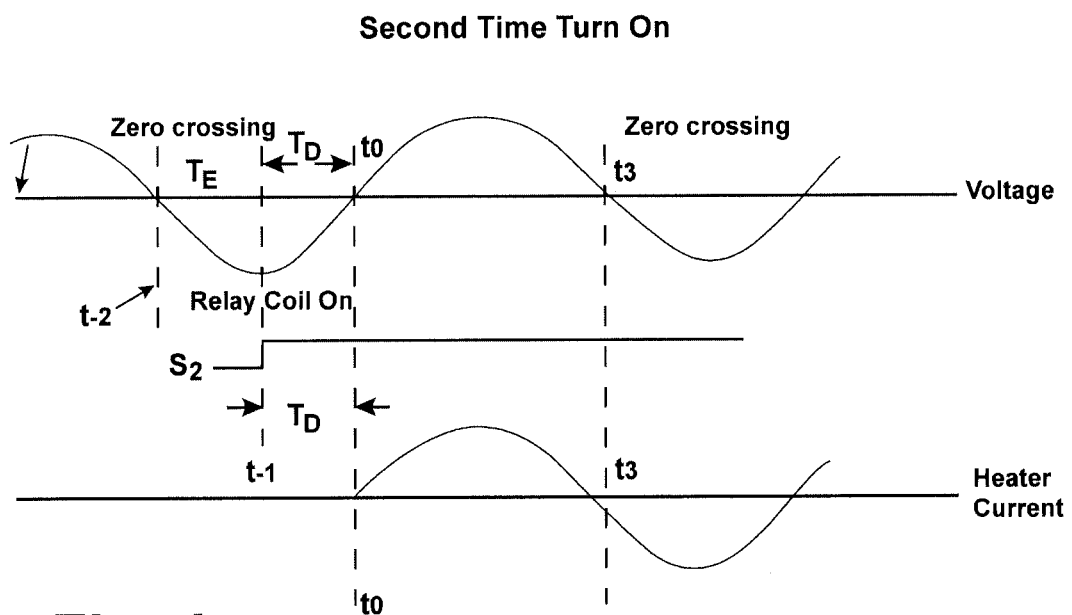
FIG. 4 is a wave form diagram illustrating a second heater "turn on" operation.

FIG. 4 illustrates circuit operation the next time that the heater 23 is turned on. Based on the input from the voltage sensing circuit 27, the microcontroller 29 "knows" that a zero crossing of the voltage waveform will occur at time $t_{-2}$. The microcontroller 29 then waits until time $t_{-1}$ to apply the control signal $S_2$ to the coil 32 of the relay B. The time interval $T_E$ between the zero crossing at $t_{-2}$ and the generation of the control signal $S_2$ at time $t_1$ is equal to a half period of the sine wave (0.5 divided by the line frequency wf, e.g. 50 or 60 Hz) minus the delay time $T_D$ or:

$$\frac{.5}{wf} - T_D$$

As illustrated in FIG. 4, generation of the control signal $S_2$ at time $t_1$ results in the relay B contacts closing and the heater current beginning to flow at a point in time $t_0$ which aligns with a zero crossing of the voltage waveform.

The predetermined delay time $T_D$ is subsequently adjusted each time the relay B is turned on, resulting in the delay time tracking relay wear over the relay's lifespan. Example Calculation: S2 turn On Delay relative to Zero Voltage Crossing=8.333ms−Sensed Current Turn On Relative to Last Zero Voltage Crossing.

Depending on the relay response time, calculations may also be adjusted to accommodate $T_d$ turn-on times of greater than ½ cycle of the AC line voltage, i.e., straddling more than one AC half-cycle.

Relay "Turn Off" Operation

With respect to the heater turn-off sequence, the timing for zero voltage crossings is again determined. Since turn off can produce extended arcing and continuation of the heater current for several milliseconds after the actual contact opening, the algorithm gradually reduces the delay until near zero current is seen at a point about 2 to 3 milliseconds after a zero cross time.

With the heater on and a request to turn off, a first zero cross is determined using the Vsense input. A delay timer is then started using a pre-determined delay from a previous cycle, or initially a time value set to slightly shorter than the sample time. At the same moment (as of the first zero cross time), a fixed-time sample timer is started. As described above, this time is set to sample the current about 2-3 milliseconds after a subsequent zero crossing, and should be set longer than any anticipated relay turn off time. Relay A is turned off when the delay timer times out, and current is sampled when the sample timer times out. The delay time is then reduced if the current at the sample point is much greater than zero amps, indicating that the relay has either not opened at all, or that arcing is occurring. This process is repeated for each subsequent turn off cycle until the delay has been reduced to the point where the current at the sample time is near zero.

In illustrative embodiments, "zero" current is typically not "absolute" zero. For example, in some embodiments with heaters that range from 16-23 amps, a ±3 amps threshold may be detected or treated as "zero." In various embodiments, switching within 1 to 2 milliseconds of a zero crossing will be effective to satisfactorily suppress contact arcing and contact wear.

Figure 5:
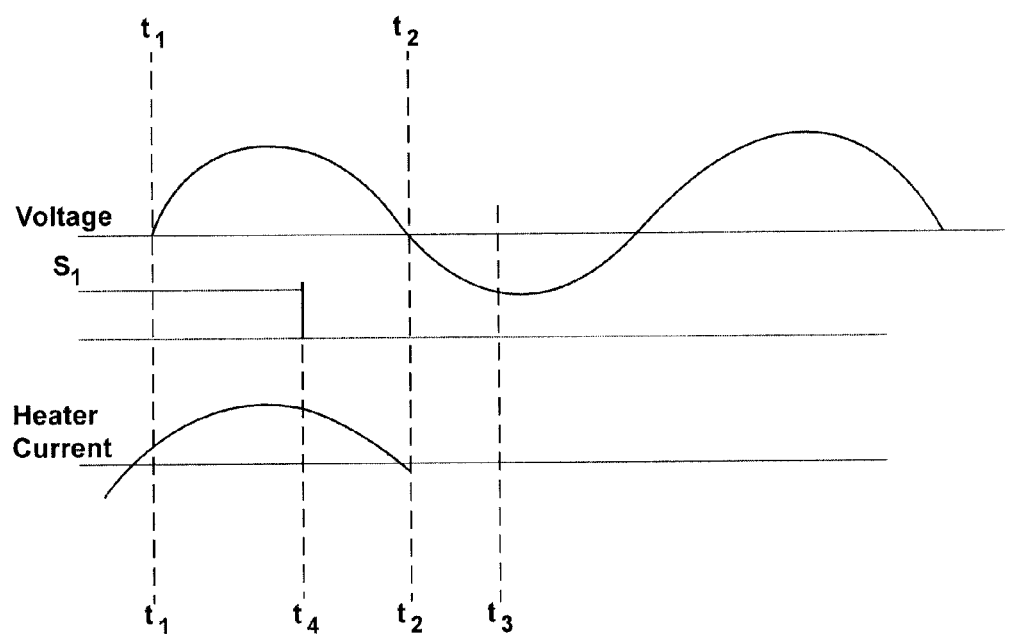
FIG. 5 is a wave form diagram illustrating a heater "turn-off" operation.

FIG. 5 further illustrates operation of one embodiment of a relay turn-off mechanism. After detection of a zero crossing at time $t_1$, a relay delay timer and a sample timer are started. When the relay delay timer times out at time $t_4$, the relay coil is de-energized. When the sample timer times out at time $t_3$, the heater current is sampled. The delay is reduced slightly for each turn off cycle until there is near zero current at the sample time $t_3$, meaning that the contacts actually opened at time $t_2$ and because it is at zero crossing, no arc-continuation current is seen at the sample time. After turning off the relay A, a check is made to ensure that the heater current went to zero. If no heater current is sensed, the controller 29 proceeds to turn off relay B, no errors. If heater current is sensed, this indicates that relay A is welded closed and the circuit has failed, requiring an appropriate corrective action to prevent creation of a safety hazard from uncontrolled heating if relay B also is welded closed. Once the relay B is turned off, the heater 23 is fully off.

An illustrative embodiment of a spa equipment control system employs both current sensors and voltage-to-pulse-width circuits for measuring various parameters. With these parameters, the power consumption of the spa can be computed and logged for reports to the owner or service technician. In addition, operation can be restricted if the voltage is too low, and the service technician can be alerted if currents suddenly shift on a particular spa device (jet pump, heater, music system, etc.).

Figure 6:
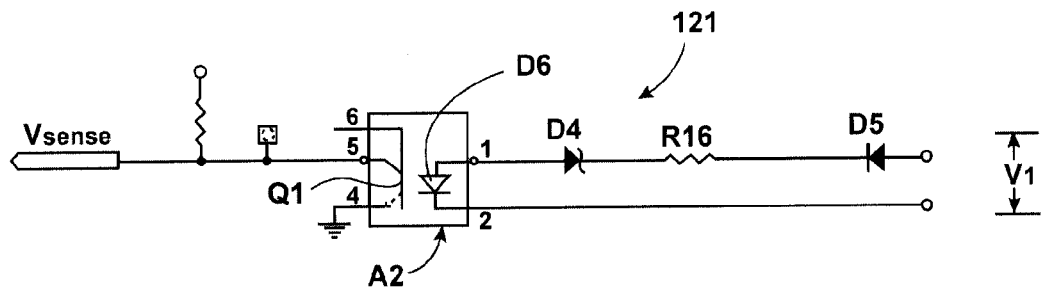
FIG. 6 is an electrical circuit diagram of an illustrative embodiment of a voltage sensor circuit.

In one embodiment, a spa is supplied from up to three high voltage circuits. To measure voltages on these circuits, the voltage-to-pulse width circuit 121 shown in FIG. 6 is used in conjunction with software to compute the line voltages in the system. FIG. 6 illustrates the following components wired in series and connected across the voltage source to be measured: a half-wave diode $D_5$, a current limiting resistance $R_{16}$, a zener diode $D_4$, and an optical coupler LED $D_6$ at the input side of an optical coupler IC $A_2$. In certain embodiments, the current limiting resistance $R_{16}$ may comprise one or more discrete resistors, for example, two 10K ohm resistors.

Figure 7:
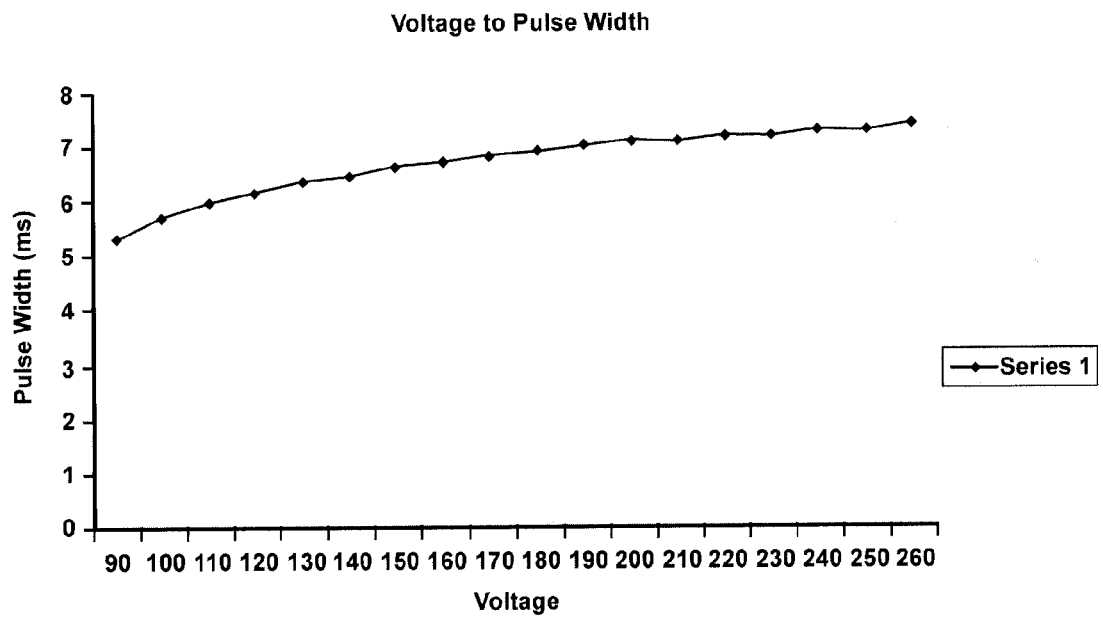
FIG. 7 is a graph illustrating the pulse width to voltage relationship for the circuit of FIG. 6.

With respect to the operation of the illustrative embodiment of FIG. 6, the diode $D_5$ causes voltage information to be provided only for every other half-cycle of the input AC voltage waveform $V_1$ (positive or negative only). Since the line voltage is a sine wave, the zener diode $D_4$ will not conduct current until its threshold is reached. Once its threshold is reached, the current starts flowing through the optical coupler LED $D_6$, resulting in the turn-on of the optical isolator output transistor $Q_1$. Once the line voltage sine wave again descends below the zener threshold, the current stops and the output transistor $Q_1$ of the optical isolator $A_2$ turns off As a result of this operation, the output $V_{sense}$ of the circuit 121 is a pulse train, whose pulse width is proportional to the line voltage $V_1$. This pulse train is timed by the microcontroller 29. The microcontroller software can then determine the following parameters:

a) Voltage, by translating the pulse width to a voltage based on either a formula or a lookup table with intermediary computations of values for points between table entries. As illustrated in FIG. 7, the pulse width-to-voltage relationship is not linear.

b) Line frequency—The period of the pulse train represents the reciprocal of the line frequency.

c) Zero cross time—The zero cross time event can be computed by determining the time of occurrence of the exact middle of a pulse, then adding or subtracting 25% of the period. This computed time is the time of zero crossing and is used in the heater relay zero cross computations described in connection with the circuit of FIG. 2. To compute the time occurrence of zero voltage cross, a free running timer is used. The system registers the timer value when each edge of the pulse occurs. Then the timer value at the midpoint of the pulse is computed. From that center value, 25% of the period time value is added or subtracted from the center time value to establish the timer value for a zero crossing.

d) Enhancing Accuracy—The accuracy of the measurements is enhanced if the zener voltage is close to the range of input voltages. To accommodate a wide range of voltages (e.g., 90 to 260 VAC), two separate circuits 121 may be used, one optimized for a lower range and a second optimized for a higher range of voltages. The microcontroller 29 compares the two measurements and uses the measurement that is optimized for the selected voltage range, resulting in enhanced accuracy.

In one embodiment of the zero cross detect circuit, e.g. of FIG. 2, the microcontroller 29 uses an edge sensitive capture input, which is part of the microcontroller hardware on the microcontroller chip itself. The microcontroller's software first sets the capture input to sense a positive transition of the $V_{sense}$ pulse train independent of software, and the next positive signal edge of the pulse train causes the value of a free-running hardware timer to be transferred at the moment of the edge to a latch. This edge also causes an interrupt to vector the microcontroller software to a routine that reads the latch value and re-programs the edge sense to sense the negative edge of the pulse train. The same process occurs when the negative edge occurs. So, the microcontroller software ends up producing a string of positive and negative edge time values for use in making the calculations described for detecting zero crossings relative to the free-running timer.

The zero cross logic is a continuous process, occurring on every positive and negative edge of the $V_{sense}$ pulse train. This implementation prevents the presumed time of the zero cross from drifting. In addition, in one embodiment, continuous edge detection must be done to monitor the line voltage, since the pulse width is used for that purpose.

Figure 8:
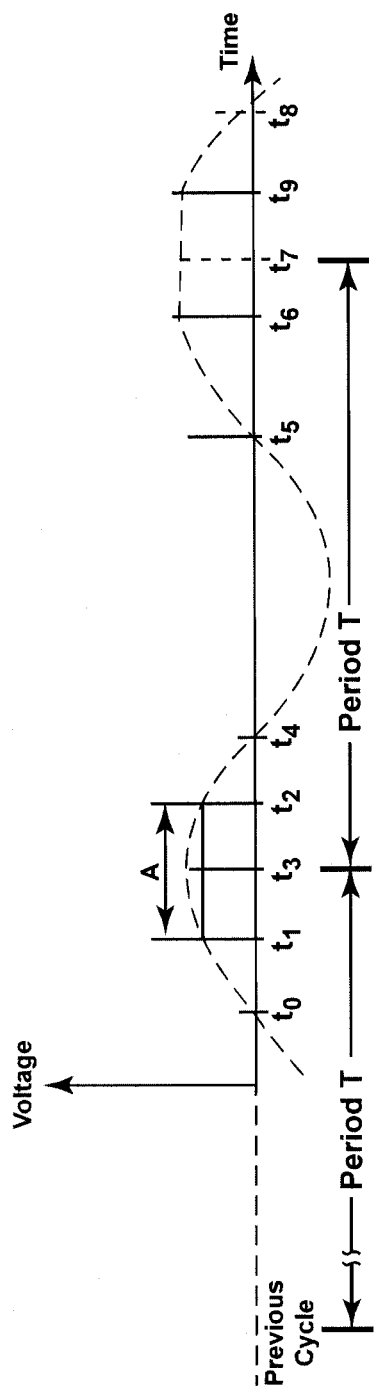
FIG. 8 illustrates an edge detect operation as performed by the illustrative embodiment.

An example of edge detection as just described is shown in FIG. 8. As may be seen, due to the nature of the optical coupler A1, the sinusoidal waveform seen on the line voltage is translated to a square wave as seen by the microcontroller edge detect input. With respect to FIG. 8, the microcontroller 29 detects pulse edges, for example, at $t_1$ and $t_2$. In FIG. 8, the period "T" is computed form the previous and current cycle, and the zero cross time is computed for the next cycle (or subsequent cycles), since it is used to turn on a relay at a prescribed time synchronized with the next zero voltage crossing. Additionally, knowing $t_1$ and $t_2$, various other times may be computed. Various illustrative computations are:

$$t_3 = t_1 + \tfrac{1}{2}(t_2 - t_1) \quad \text{(equation 1)}$$

$$\text{Sinewave Period} = T = t_7 - t_3 \quad \text{(equation 2)}$$

$$\text{Zero crossing } t_0 = t_3 - \tfrac{1}{4}T \quad \text{(equation 3)}$$

$$\text{Zero crossing } t_4 = t_3 + \tfrac{1}{4}T \quad \text{(equation 4)}$$

$$\text{Zero crossing } t_5 = t_4 + \tfrac{1}{2}T \quad \text{(equation 5)}$$

Temperature-Relative Load Control—An illustrative control system embodiment utilizes a single high-capacity power supply to provide power to the internal electronics of the control system, as well as peripherals connected to RS-485 and I2C busses, such as chlorine generators, light systems, audio systems and so forth. Since the spa environment is very warm, the temperature may reduce the load capability of the power supply. In one embodiment, the microcontroller 29 can be configured to respond to these circumstances by a method comprising the following steps:

1) Monitor the temperature inside the control box, in relative proximity to the power supply module. The control box typically contains control componentry such as microprocessors, relays, bus drivers, analog interfaces and so forth.
2) Monitor the current flowing to the peripherals.
3) If the temperature is at or above one of several thresholds, and the current measured is above the limit for that temperature, send commands to the various peripherals to force them to power down, thus reducing the loading.
4) Continue shut downs on peripherals until within range for the power supply.

The foregoing discussion sets forth logic for implementing control functions which may be implemented in various embodiments. In one embodiment, such logic may comprise hard wired logic. In other illustrative embodiments, such logic, as well as other logic discussed herein, is embodied in one or more computer programs or computer software, for example, such as an application written in C, assembly, or other suitable programming language. In one embodiment shown in FIG. 2, such software is stored on a computer readable medium or media 23 and may be executed by a microcontroller 29, which may comprise, for example, one or more microprocessors, digital processors, central processing unit(s) (CPUs), or other computer(s). In an illustrative embodiment, the microcontroller 29 may comprise a PIC32 microprocessor with 512K bytes of flash ROM, suitable amounts of RAM, EEPROM, and adequate I/O peripherals for the various serial port functions, for example, such as two RS-485 buses, I2C, SPI, etc. Apparatus for executing instructions of such computer programs or software may comprise part of either the spa controller 29 or the control head 31, or both, in various embodiments.

For the purposes of this disclosure, a computer readable medium stores computer data, which data can include computer program code that is executable by a computer, in machine readable form. By way of example, and not limitation, a computer readable medium may comprise computer readable storage medium or media, for tangible or fixed storage of data, or communication media for transient interpretation of code-containing signals. Computer readable storage medium or media, as used herein, refers to physical or tangible storage (as opposed to signals) and includes without limitation volatile and non-volatile, removable and non-removable storage media implemented in any method or technology for the tangible storage of information such as computer-readable instructions, data structures, program modules or other data. Computer readable storage media includes, but is not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices, or any other physical or material medium which can be used to tangibly store the desired information or data or instructions and which can be accessed by a computer or processor. In certain embodiments, when suitable computer program code is loaded into and executed by a computer, the computer becomes a specially configured apparatus.

Those skilled in the art will appreciate that various adaptations and modifications of the just described preferred embodiment can be configured without departing from the scope and spirit of the invention. Therefore, it is to be understood that, within the scope of the appended claims, the invention may be practiced other than as specifically described herein.

What is claimed is:

1. Voltage sensing circuitry comprising:
    a first diode connected in series with a current limiting resistance which is in turn connected in series with a Zener diode which is in turn connected in series with an optical coupler LED;
    wherein an A.C. input voltage to be sensed is coupleable across one terminal of said first diode and one terminal of said optical coupler LED; and
    wherein the optical coupler LED comprises part of an optical coupler circuit having an output which provides a voltage sense signal comprising a pulse train comprising a plurality of pulses whose respective pulse widths are proportional to the magnitude of the A.C. input voltage.

2. The voltage sensing circuitry of claim 1 further comprising one or more microcontrollers or microprocessors configured to
    (a) determine the magnitude of the A.C. input voltage from the pulse width of the sensed voltage;
    (b) determine the frequency of the A.C. input voltage utilizing the period of the pulse train; and
    (c) determine a zero cross time of the A.C. input voltage waveform.

3. The voltage sensing circuitry of claim 2 wherein the zero cross time is determined by implementing a timer to determine a timer value each time an edge of a pulse of the A.C. input voltage occurs.

4. The voltage sensing circuitry of claim 2 wherein the zero cross time is computed by determining a time of occurrence of the middle of a voltage waveform pulse and then adding or subtracting 25% of that period.

5. The voltage sensing circuitry of claim 2 wherein, to compute the zero cross time, a free running timer is used and the one or more microcontrollers or microprocessors registers the timer value when each edge of a pulse of said pulse train occurs, then computes a center timer value at a midpoint of the pulse, and then adds or subtracts 25% of that timer value to or from the center timer value to establish the timer value for a zero crossing.

6. The voltage sensing circuitry of claim 2 wherein the microcontroller employs an edge sensitive capture input and further employs software to first set the edge sensitive capture input to sense a positive transition of a voltage pulse train, whereafter the next positive signal edge of the pulse train causes the value of a free-running hardware timer to be transferred to a latch at the moment of the said next positive signal edge and also causes an interrupt to vector the microcontroller to a software routine which reads the latch value and re-programs the edge sensitive capture input to sense a negative edge of the pulse train.

7. The voltage sensing circuitry of claim 5 wherein the same process occurs when a negative edge of the voltage pulse train occurs, such that the microcontroller software produces a string of positive and negative edge time values.

8. Voltage sensing circuitry comprising:
    a first diode connected in series with a current limiting resistance which is in turn connected in series with a Zener diode which is in turn connected in series with an optical coupler LED;
    wherein an A.C. input voltage to be sensed is coupleable across one terminal of said first diode and one terminal of said optical coupler LED; and wherein the optical coupler LED comprises part of an optical coupler circuit having an output comprising a voltage sense signal.

9. The voltage sensing circuitry of claim 8 wherein the voltage sense signal comprises a pulse train and wherein the voltage sensing circuitry further comprises one or more microcontrollers or microprocessors configured to employ the voltage sense signal to determine the magnitude of the A.C. input voltage from a pulse width of the pulse train.

10. The voltage sensing circuitry of claim 8 wherein the voltage sense signal comprises a pulse train and wherein the voltage sensing circuitry further comprises one or more microcontrollers or microprocessors configured to employ the voltage sense signal to determine the frequency of the A.C. input voltage utilizing a period of the pulse train.

11. The voltage sensing circuitry of claim 8 wherein the voltage sense signal comprises a pulse train and wherein the voltage sensing circuitry further comprises one or more microcontrollers or microprocessors configured to employ the voltage sense signal to determine a zero cross time of the A.C. input voltage waveform.

12. The voltage sensing circuitry of claim 11 wherein the zero cross time is determined by implementing a timer to determine a timer value each time an edge of a pulse of the A.C. input voltage occurs.

13. The voltage sensing circuitry of claim 11 wherein the zero cross time is computed by determining a time of occurrence of the middle of a voltage waveform pulse and then adding or subtracting 25% of that period.

14. The voltage sensing circuitry of claim 11 wherein, to compute the zero cross time, a free running timer is used and the one or more microcontrollers or microprocessors registers the timer value when each edge of a pulse of said pulse train occurs, then computes a center timer value at a midpoint of the pulse, and then adds or subtracts 25% of that timer value to or from the center timer value to establish the timer value for a zero crossing.

15. The voltage sensing circuitry of claim 11 wherein the microcontroller employs an edge sensitive capture input and further employs software to first set the edge sensitive capture input to sense a positive transition of a voltage pulse train, whereafter the next positive signal edge of the pulse train causes the value of a free-running hardware timer to be transferred to a latch at the moment of the said next positive signal edge and also causes an interrupt to vector the microcontroller to a software routine which reads the latch value and re-programs the edge sensitive capture input to sense a negative edge of the pulse train.

16. The voltage sensing circuitry of claim 14 wherein the same process occurs when a negative edge of the voltage pulse train occurs, such that the microcontroller software produces a string of positive and negative edge time values.

17. Voltage sensing circuitry comprising:
a first diode connected in series with a current limiting resistance which is in turn connected in series with a Zener diode which is in turn connected in series with an optical coupler LED;
wherein the optical coupler LED comprises part of an optical coupler circuit having an output comprising a voltage sense signal; and
wherein the first diode is connected to a first line voltage input and the optical coupler LED is connected to a second line voltage input.

18. The voltage sensing circuitry of claim 17 wherein the voltage sense signal comprises a pulse train and wherein the voltage sensing circuitry further comprises one or more microcontrollers or microprocessors configured to employ the voltage sense signal to determine the magnitude of the A.C. input voltage from a pulse width of the pulse train.

* * * * *